United States Patent
Vedula et al.

(10) Patent No.: US 12,206,400 B2
(45) Date of Patent: Jan. 21, 2025

(54) DYNAMIC BODY BIASING FOR RADIO FREQUENCY (RF) SWITCH

(71) Applicant: QUALCOMM Incorporated, San Diego, CA (US)

(72) Inventors: Ravi Pramod Kumar Vedula, San Diego, CA (US); Abhijeet Paul, Escondido, CA (US); Hyunchul Jung, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/892,800

(22) Filed: Aug. 22, 2022

(65) Prior Publication Data
US 2024/0063787 A1 Feb. 22, 2024

(51) Int. Cl.
*H03K 17/687* (2006.01)
*H04B 1/44* (2006.01)
*H01L 27/12* (2006.01)

(52) U.S. Cl.
CPC ............ *H03K 17/687* (2013.01); *H04B 1/44* (2013.01); *H01L 27/1203* (2013.01)

(58) Field of Classification Search
CPC ......... H03K 17/687; H03K 2217/0018; H03K 17/161; H03K 17/063; H03K 2017/066; H03K 2217/0054; H03K 3/012; H01L 27/1203; H01L 2223/6677; H01L 29/78615; H04B 1/48; H04B 1/44
See application file for complete search history.

(56) References Cited

U.S. PATENT DOCUMENTS

| | | | |
|---|---|---|---|
| 9,800,285 B2 | 10/2017 | Li et al. | |
| 10,115,787 B1* | 10/2018 | Paul | H01L 29/0649 |
| 10,475,816 B2 | 11/2019 | Vedula et al. | |
| 11,139,813 B1 | 10/2021 | Cattaneo et al. | |
| 2001/0023094 A1* | 9/2001 | D'Arrigo | H01L 21/7624 |
| | | | 257/E21.216 |
| 2002/0036322 A1* | 3/2002 | Divakauni | H01L 23/535 |
| | | | 257/E21.59 |
| 2003/0190895 A1 | 10/2003 | Mostov et al. | |
| 2008/0258799 A1 | 10/2008 | Teraguchi et al. | |
| 2014/0009214 A1 | 1/2014 | Altunkilic et al. | |
| 2020/0036370 A1* | 1/2020 | Franck | H03K 17/102 |

(Continued)

FOREIGN PATENT DOCUMENTS

| | | |
|---|---|---|
| CN | 106911326 A | 6/2017 |
| WO | 2014011510 A2 | 1/2014 |
| WO | 2015179201 A1 | 11/2015 |

OTHER PUBLICATIONS

International Search Report and Written Opinion—PCT/US2023/026621—ISA/EPO—Oct. 2, 2023.

(Continued)

*Primary Examiner* — Jung Kim
(74) *Attorney, Agent, or Firm* — Seyfarth Shaw LLP

(57) ABSTRACT

A radio frequency integrated circuit (RFIC) is described. The RFIC includes a switch field effect transistor (FET). The switch FET includes a source region, a drain region, a body region, and a gate region. The RFIC also includes a dynamic bias control circuit. The dynamic bias control circuit includes at least one transistor coupled between the body region and the gate region of the switch FET.

7 Claims, 11 Drawing Sheets

(56) References Cited

U.S. PATENT DOCUMENTS

2024/0063790 A1   2/2024   Vedula et al.

OTHER PUBLICATIONS

Niranjan V., et al., "Low Voltage Flipped Voltage Follower Based Current Mirror using DTMOS Technique", IMPACT-2013, IEEE, Nov. 23, 2013, pp. 250-254, XP032596864, DOI: 10.1109/MSPCT.2013.6782129, p. 251, right-hand col., paragraph third, figure 2.

Xu P., et al., "A Self-Gating RF Energy Harvester for Wireless Power Transfer With High-PAPR Incident Waveform", IEEE Journal of Solid-state Circuits, USA, vol. 56, No. 6, Mar. 8, 2021, pp. 1816-1826, XP011856415, Doi: 10.1109/JSSC.2021.3061196, figure 2.

\* cited by examiner

DYNAMIC BODY BIASING FOR RADIO FREQUENCY (RF) SWITCH

TECHNICAL FIELD

The present disclosure generally relates to integrated circuits (ICs). More specifically, the present disclosure relates to dynamic body biasing for a radio frequency (RF) switch.

BACKGROUND

The design complexity of mobile radio frequency (RF) chips (e.g., mobile RF transceivers) is complicated by added circuit functions for supporting communications enhancements. Designing mobile RF transceivers may include using semiconductor on insulator technology. Semiconductor on insulator (SOI) technology replaces conventional semiconductor (e.g., silicon) substrates with a layered semiconductor-insulator-semiconductor substrate for reducing parasitic device capacitance and improving performance. SOI-based devices differ from conventional, silicon-built devices because a silicon junction is above an electrical isolator, typically a buried oxide (BOX) layer. A reduced thickness BOX layer, however, may not sufficiently reduce artificial harmonics caused by the proximity of an active device on the SOI layer and an SOI substrate supporting the BOX layer.

For example, high performance complementary metal oxide semiconductor (CMOS) radio frequency (RF) switch technologies are currently manufactured using SOI substrates. While SOI substrates may provide some protection against out-of-band harmonics in RF transceivers, there is a need for increasing device isolation and reducing RF loss. Furthermore, a transistor fabricated using SOI technology may suffer from the floating body effect, in which the transistor's body collects a charge generated at the junctions of the transistor device.

SUMMARY

A radio frequency integrated circuit (RFIC) is described. The RFIC includes a switch field effect transistor (FET). The switch FET includes a source region, a drain region, a body region, and a gate region. The RFIC also includes a dynamic bias control circuit. The dynamic bias control circuit includes at least one transistor coupled between the body region and the gate region of the switch FET.

A method of constructing a radio frequency integrated circuit (RFIC) having a switch field effect transistor (FET) is described. The method includes tying a gate region to a body region of the switch FET. The method also includes forming a dynamic bias control circuit between the gate region and the body region of the switch FET. The dynamic bias control circuit includes at least one transistor between the gate region and the body region of the switch FET.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
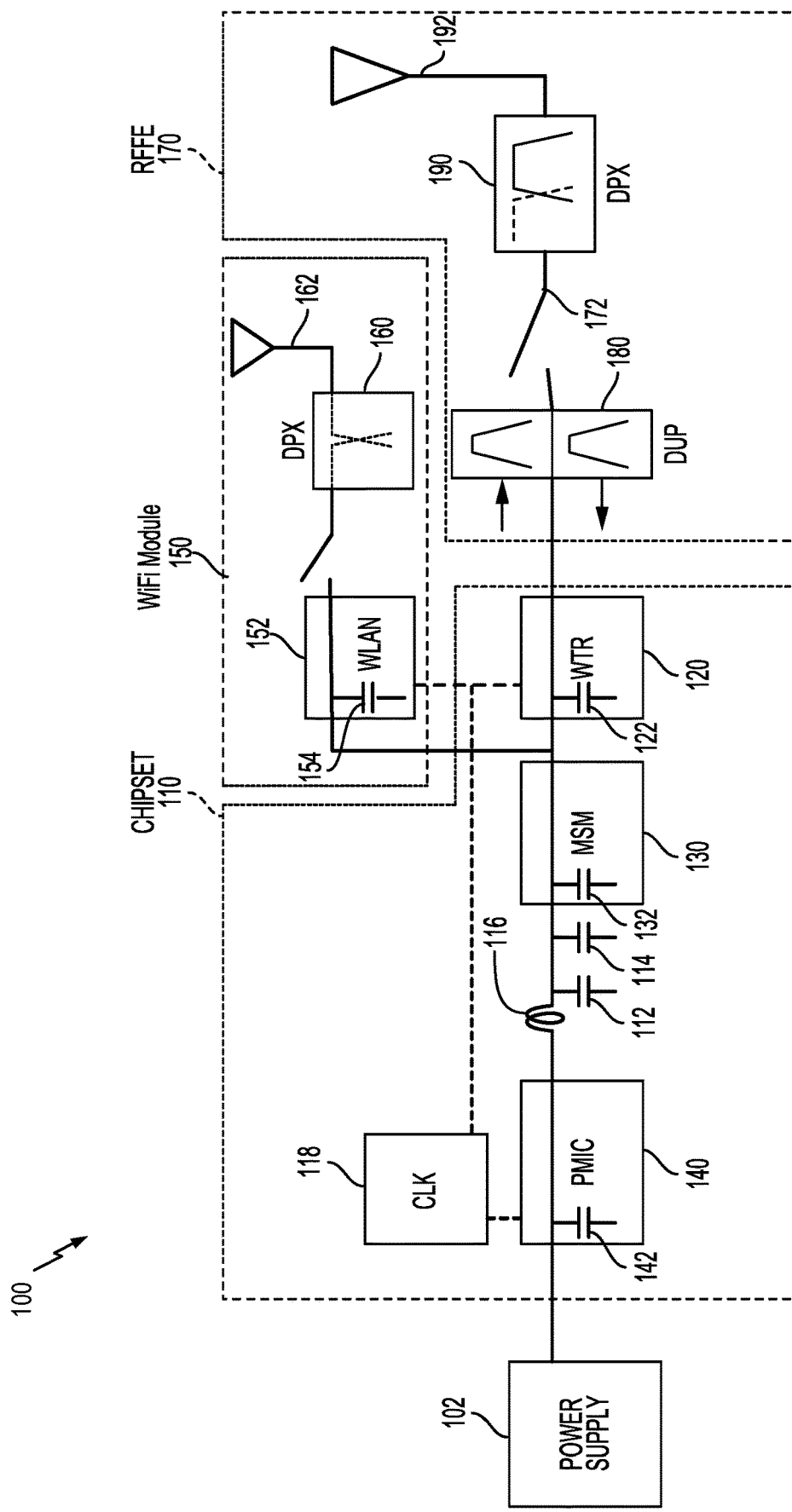
FIG. 1 is a schematic diagram of a wireless device having a wireless local area network module and a radio frequency (RF) front end module for a chipset.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR," and the use of the term "or" is intended to represent an "exclusive OR." As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Mobile radio frequency (RF) chips (e.g., mobile RF transceivers) have migrated to a deep sub-micron process node due to cost and power consumption considerations. Designing mobile RF transceivers may include using semiconductor on insulator technology. Semiconductor on insulator (SOI) technology replaces conventional silicon substrates with a layered semiconductor-insulator-semiconductor substrate for reducing parasitic device capacitance and improving performance. SOI-based devices differ from conventional, silicon-built devices because a silicon junction is above an electrical isolator, typically a buried oxide (BOX) layer. A reduced thickness BOX layer, however, may not sufficiently reduce artificial harmonics caused by the proximity of an active device on an SOI layer and an SOI substrate supporting the BOX layer.

For example, a thickness of the BOX layer determines a distance between the active devices and an SOI substrate separated from the active devices by the BOX layer. A sufficient distance between the active device and the SOI substrate is important for improving active device performance. Reducing device footprints for meeting specifications of future process nodes, however, reduces a thickness of the BOX layer, which defines the distance between the active device and the SOI substrate. Reducing the thickness of the BOX layer in future process nodes may significantly reduce device performance due to artificial harmonics. That is, device performance is degraded by increasing a proximity of the active device and the SOI substrate in future process nodes.

The active devices on the SOI layer may include high performance complementary metal oxide semiconductor (CMOS) transistors. For example, high performance CMOS RF switch technologies are currently manufactured using SOI substrates. An RF front end (RFFE) may rely on these high performance CMOS RF switch technologies for successful operation. A process for fabricating an RFFE, therefore, involves the costly integration of an SOI wafer for supporting these high performance CMOS RF switch technologies. Furthermore, support for future RF performance enhancements involves increased device isolation while reducing RF loss.

One technique for increasing device isolation and reducing RF loss is fabricating an RFFE using SOI wafers. For example, an RF device (e.g., an RF switch device) may include transistors fabricated using an SOI wafer. Unfortunately, transistors fabricated using SOI technology may suffer from the floating body effect. The floating body effect is a phenomenon in which the transistor's body collects a charge generated at junctions of the transistor device. In this case, the charge that accumulates in the body causes adverse effects, such as parasitic transistors in the structure and OFF-state leakage. In addition, the accumulated charge also causes dependence of the threshold voltage of the transistor on its previous states. The floating body effect may also generate out-of-band harmonic frequencies, which are detrimental to future communications enhancements.

Various aspects of the present disclosure provide techniques for a dynamic bias control circuit for improving a breakdown voltage and harmonic performance of an RF switch device. The process flow for semiconductor fabrication of the integrated RF circuit having an RF switch device may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms "chip" and "die" may be used interchangeably.

Aspects of the present disclosure relate to a dynamic bias control circuit for improving the performance of an RF switch device. That is, aspects of the present disclosure employ a dynamic control of at least one transistor of the dynamic bias control circuit to dynamically bias a body bias of the RF switch device. According to this aspect of the present disclosure, an RF integrated circuit (RFIC) includes a switch field effect transistor (FET) having a source region, a drain region, a body region, and a gate region. The RFIC also includes a dynamic bias control circuit including at least one transistor coupled between the body region and the gate region of the switch FET.

FIG. 1 is a schematic diagram of a wireless device 100 (e.g., a cellular phone or a smartphone) including a dynamic bias control circuit for improving the performance of a radio frequency (RF) switch device, according to aspects of the present disclosure. The wireless device 100 has a wireless local area network (WLAN) (e.g., WiFi) module 150 and an RF front end module 170 for a chipset 110. The WiFi module 150 includes a first diplexer 160 communicably coupling an antenna 162 to a wireless local area network module (e.g., WLAN module 152). The RF front end module 170 includes the second diplexer 190 communicably coupling an antenna 192 to the wireless transceiver 120 (WTR) through a duplexer 180 (DUP). An RF switch 172 communicably couples the second diplexer 190 to the duplexer 180. The wireless transceiver 120 and the WLAN module 152 of the WiFi module 150 are coupled to a modem (MSM, e.g., a baseband modem) 130 that is powered by a power supply 102 through a power management integrated circuit (PMIC) 140. The chipset 110 also includes capacitors 112 and 114, as well as an inductor(s) 116 to provide signal integrity. The PMIC 140, the modem 130, the wireless transceiver 120, and the WLAN module 152 each include capacitors (e.g., 142, 132, 122, and 154) and operate according to a clock 118. The geometry and arrangement of the various inductor and capacitor components in the chipset 110 may reduce the electromagnetic coupling between the components.

The wireless transceiver 120 of the wireless device generally includes a mobile RF transceiver to transmit and receive data for two-way communication. A mobile RF transceiver may include a transmit section for data transmission and a receive section for data reception. For data transmission, the transmit section may modulate an RF carrier signal with data to obtain a modulated RF signal, amplify the modulated RF signal using a power amplifier (PA) to obtain an amplified RF signal having the proper output power level, and transmit the amplified RF signal via the antenna 192 to a base station. For data reception, the receive section may obtain a received RF signal via the antenna and may amplify the received RF signal using a low noise amplifier (LNA) and process the received RF signal to recover data sent by the base station in a communication signal.

The wireless transceiver 120 may include one or more circuits for amplifying these communication signals. The amplifier circuits (e.g., LNA/PA) may include one or more amplifier stages that may have one or more driver stages and one or more amplifier output stages. Each of the amplifier stages includes one or more transistors configured in various ways to amplify the communication signals. Various options exist for fabricating the transistors that are configured to amplify the communication signals transmitted and received by the wireless transceiver 120.

The wireless transceiver 120 and the RF front end module 170 may be implemented using semiconductor on insulator (SOI) technology for fabricating transistors of the wireless transceiver 120, which helps reduce high order harmonics in the RF front end module 170. SOI technology replaces conventional semiconductor substrates with a layered semiconductor-insulator-semiconductor substrate for reducing parasitic device capacitance and improving performance. SOI-based devices differ from conventional, silicon-built devices because a silicon junction is above an electrical isolator, typically a buried oxide (BOX) layer. A reduced thickness BOX layer, however, may not sufficiently reduce artificial harmonics caused by the proximity of an active device on an SOI layer and an SOI substrate supporting the BOX layer. An active device fabricated using SOI technology is shown in FIG. 2.

Figure 2:
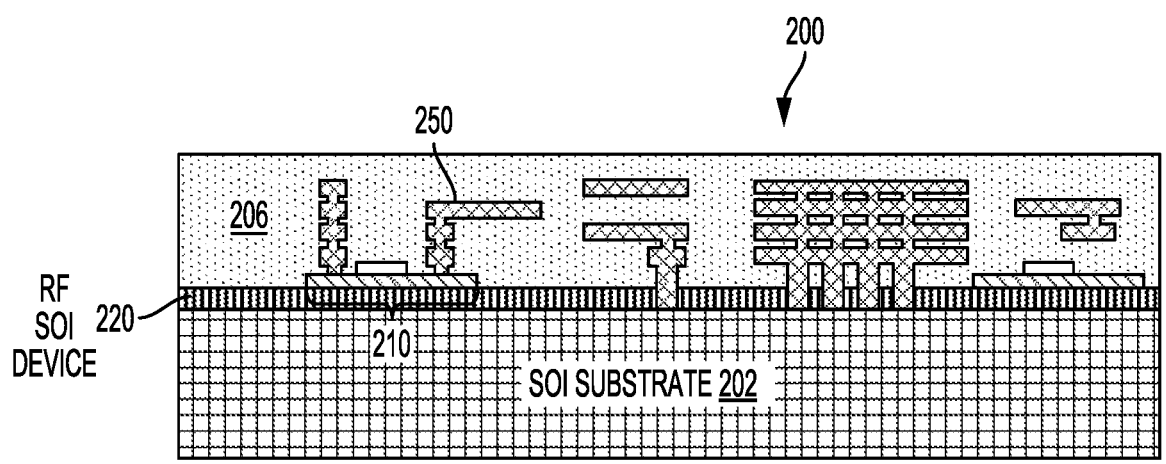
FIG. 2 shows a cross-sectional view of a radio frequency (RF) integrated circuit (RFIC), including an RF silicon on insulator (SOI) device.

FIG. 2 shows a cross-sectional view of a radio frequency (RF) integrated circuit (RFIC) 200. As shown in FIG. 2, an RF silicon on insulator (SOI) device includes an active device 210 on a buried oxide (BOX) layer 220 supported by an SOI substrate 202 (e.g., a silicon wafer). The RF SOI device may be fabricated as a complementary metal oxide semiconductor (CMOS) transistor using a CMOS process. The RF SOI device also includes interconnects 250 coupled to the active device 210 within a first dielectric layer 206. In this configuration, a parasitic capacitance of the RF SOI device is proportional to a thickness of the BOX layer 220, which determines the distance between the active device 210 and the SOI substrate 202.

The active device 210 on the BOX layer 220 may be a CMOS transistor. For example, high performance CMOS RF switch technologies are currently manufactured using SOI substrates. The RFFE 170 (FIG. 1) may rely on these high performance CMOS RF technologies for successful operation. A process for fabricating the RFFE 170, therefore, involves integration of an SOI wafer to support these high performance CMOS RF technologies. Furthermore, support for future RF performance enhancements involves increased device isolation while reducing RF loss. The RF integrated circuit 200 may be used to implement the RFFE 170 in FIG. 1. For example, the active device 210 may be a switch field effect transistor (FET) of the RF switch 172 of the RFFE 170.

The configuration of the RF integrated circuit 200 increases device isolation and reduces RF loss by using an SOI wafer for implementing the RFFE 170. Unfortunately, because the RF integrated circuit 200 is fabricated using SOI technology, the active device 210 may suffer from the floating body effect. The floating body effect is a phenomenon in which the transistor's body collects charge generated at the junctions of the transistor device. Charge that accumulates in the body causes adverse effects, such as parasitic transistors in the structure and OFF-state leakage (e.g., a gate induced drain leakage (GIDL) current). In addition, the accumulated charge also causes dependence of the threshold voltage of the transistor on its previous states. The floating body effect may also generate undesired, out-of-band harmonic frequencies, which are detrimental to communication enhancements integrated within the RFFE 170.

During an OFF-state, the active device 210 (e.g., a switch field effect transistor (FET)) isolates the RF integrated circuit from an input power (Pin). Isolation of the input power Pin by the active device 210 is increased by negatively biasing a gate of the active device 210, for hard turn-off of the active device 210. Unfortunately, negatively biasing the gate of the active device 210 may significantly increase a gate-to-drain voltage (Vgd) of the active device 210. The high gate-to-drain voltage Vgd triggers a gate induced drain leakage (GIDL) current, causing positive charge to accumulate in a body of the active device 210. That is, a high potential difference between the gate and the drain of the switch FET causes the GIDL current.

Furthermore, when an RF signal is received at the drain of the active device 210, that is in the biased in OFF-state, the transmission of the RF signal may be corrupted along the intended path if the active device 210 is not fully isolated. For example, if the gate of the active device 210 fails to isolate the RF signal from, for example, a power supply coupled to the active device 210, the RF signal is significantly corrupted. Isolating the RF signal (e.g., the gate) from a power supply may be referred to as RF isolation.

Current switch products may include a body contact for extracting the accumulated charge in the body of the switch transistor by biasing the body contact of the switch FET (e.g., the active device 210) independently from the gate of the switch FET. In addition, resistors may be used for RF isolating the gate of the switch FET from the power supply. While these techniques provide RF isolation, biasing the body independently from biasing the gate of the switch FET causes the body to move independently from the gate. This independent movement of the body may generate undesired out-of-band harmonics. Furthermore, separately biasing the gate and the body may involve separate charge pumps for providing external gate and body voltages. Using separate charge pumps, however, consumes significant chip area of the RF integrated circuit 200.

One technique for preventing independent movement of the body involves tying the body contact to the gate of the switch FET using a diode. In addition, an external resistor may be coupled to a node of a gate-to-body tie for providing RF isolation of the gate from the power supply for protecting RF signals. While the external resistor provides RF isolation, a voltage drop across the external resistor (e.g., due to the body current Ib) may reduce a voltage at the gate of the switch FET. This reduced gate voltage (Vg) reduces negative biasing of the gate, resulting in gate de-biasing of the switch FET. Gate de-biasing of the switch FET prevents the gate from isolating the switch FET from the input power Pin.

Reducing the gate voltage Vg also reduces a breakdown voltage of the switch FET because the breakdown voltage is a function of the gate voltage Vg. That is, the gate voltage Vg is negatively affected by the body current Ib of the switch FET due to the voltage drop across the external resistor. As noted above, the body current Ib is based on a magnitude of the input power Pin at the gate of the switch FET. As a result, the maximum breakdown voltage of the switch FET is limited by the body current Ib of the switch FET because the body current substantially reduces the gate voltage Vg.

Figure 3A:
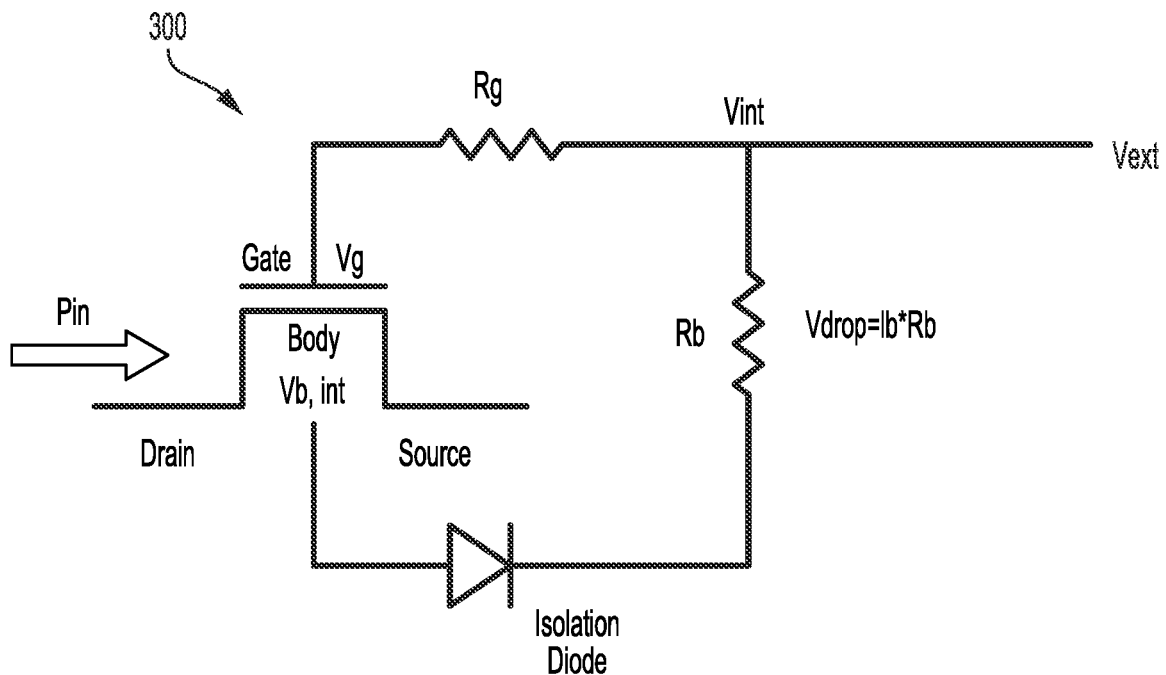
FIG. 3A is a schematic diagram illustrating a switch field effect transistor (FET) including a body current bypass resistor for improving a breakdown voltage and harmonic performance.

FIG. 3A is a schematic diagram illustrating a switch field effect transistor (FET) including a body current bypass resistor for improving a breakdown voltage and harmonic performance. In this configuration, an isolation diode is used for tying a body with a gate of a switch FET 300. In this example, the switch FET 300 does not include an external resistor for isolating the switch FET 300 from a power supply, which may be electrically coupled to an external voltage (Vext) node. Eliminating the external resistor may prevent de-biasing of the gate of the switch FET 300. Eliminating the external resistor causes an internal gate voltage (Vgint) node to equal an external voltage (Vext) of the switch FET 300.

In this configuration, a body bypass resistor (Rb) is coupled between the body and the gate of the switch FET 300. In this example, the isolation diode is electrically coupled between the body bypass resistor Rb and the body of the switch FET 300. A resistance of the body bypass resistor Rb may be reduced for allowing a charge to escape from the body of the switch FET 300. The small body bypass resistor Rb provides RF isolation of the body by allowing charge to escape from the body through the isolation diode, without de-biasing the gate, due to an increased body voltage (Vb). In addition, further preventing of gate de-biasing may be achieved by electrically coupling a gate isolation resistor (Rg) between the body bypass resistor Rb and the gate of the switch FET 300.

Figure 3B:
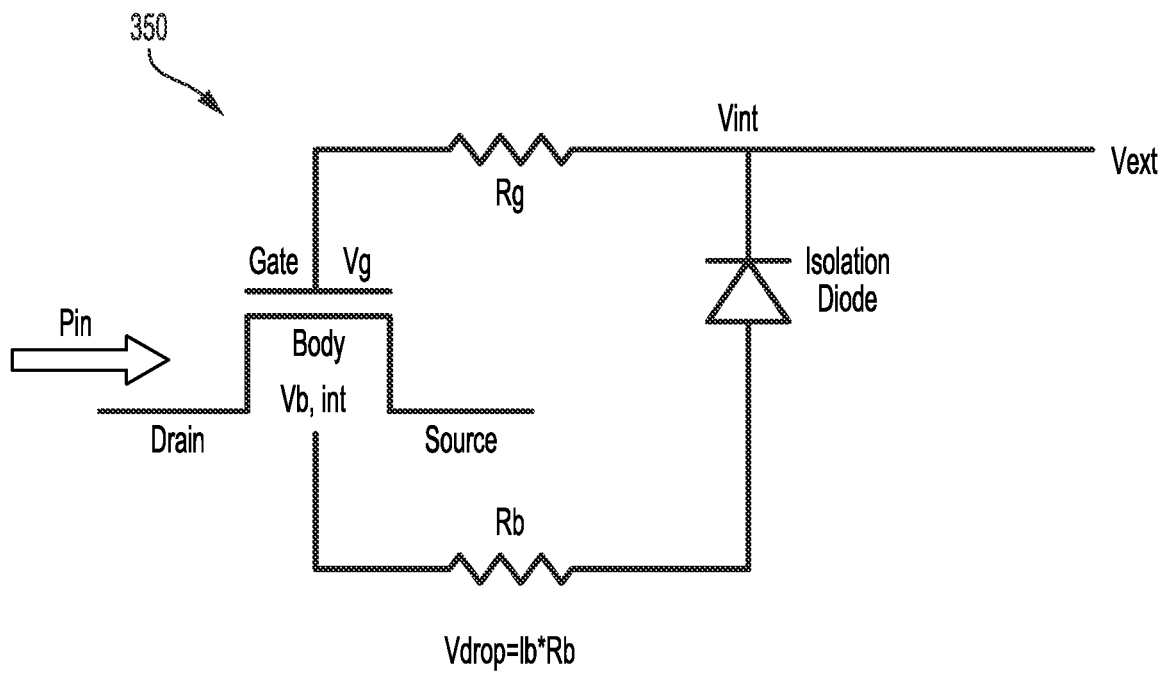
FIG. 3B is a schematic diagram illustrating a switch field effect transistor (FET) including a body current bypass resistor for further improving a breakdown voltage and harmonic performance.

FIG. 3B is a schematic diagram illustrating a switch field effect transistor (FET) 350 including a body current bypass resistor for further improving a breakdown voltage and harmonic performance. In this example, a gate isolation resistor (Rg) is electrically coupled between an internal voltage (Vint) node and a gate of the switch FET 350. In addition, a body bypass resistor (Rb) is electrically coupled between an isolation diode and a body of the switch FET 350. In this example, the isolation diode and the gate isolation resistor Rg are both electrically coupled to the Vint node of the switch FET 350.

Figure 4:
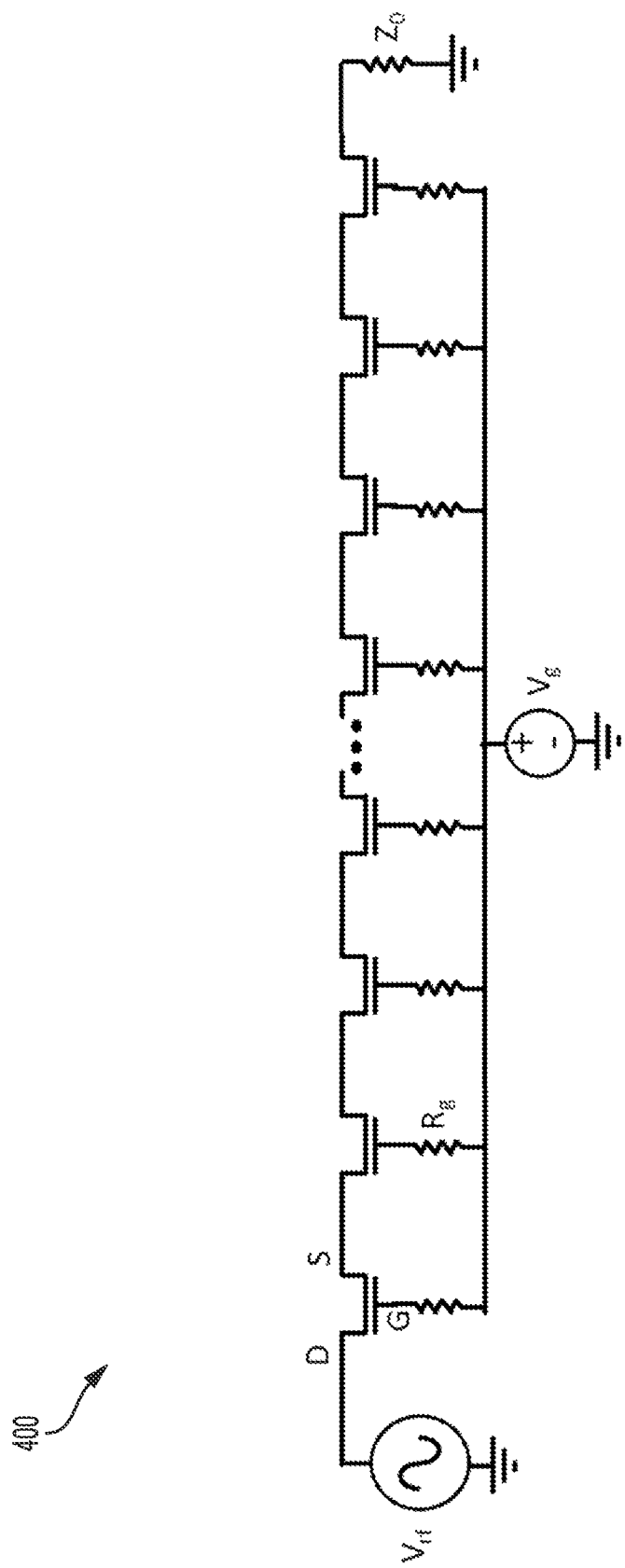
FIG. 4 is a schematic diagram illustrating a switch stack including switch field effect transistors (FETs) having a dynamic bias control circuit, according to aspects of the present disclosure.

In the configuration shown in FIG. 4, a resistance of the gate isolation resistor Rg is greater than or equal to the resistance of the body bypass resistor Rb. In addition, a size of the gate isolation resistor Rg is selected to tune the switching time of the switch FET 350. In addition, a resistance of the body bypass resistor Rb may be reduced for allowing charge to escape from the body of the switch FET 350. The small body bypass resistor Rb provides RF isolation of the body and simultaneously allows a regulated GIDL current to flow through the isolation diode and out to an external voltage (Vext) node, without de-biasing the gate.

In operation, the isolation diode electrically couples the gate and body nodes of the switch FET 350 for ensuring high linearity. In addition, the internal voltage Vint as well as the external voltage Vext are determined according to a voltage drop (Vdrop) across the body bypass resistor Rb (Vdrop=Ib*Rb). A switching time of the switch FET 350 is tuned according to the gate isolation resistor Rg, independently from the body bypass resistor Rb, and without impacting the gate voltage Vg. In addition, this configuration of the switch FET 350 supports a single charge pump, which saves significant semiconductor chip area.

The configurations of the switch FET 300 shown in FIG. 3A and the switch FET 350 shown in FIG. 3B solve some of the previous problems associated with gate de-biasing, and provide area optimization of level shifters and charge pumps. Nevertheless, these configurations of the switch FET 300 and the switch FET 350 suffer from an internal body voltage (Vbint) being lower than the external voltage (Vext) (e.g., Vext−diode voltage (Vdiode)−Vdrop~0.7 V). Having the internal body voltage Vbint lower than the external voltage Vext negatively impacts breakdown of short channel devices. In addition, these configurations of the switch FET 300 and the switch FET 350 also suffer from a higher real loss (represented by Rp), especially when implemented in a switch product, for example, as shown in FIG. 4.

FIG. 4 is a schematic diagram illustrating a switch stack 400 including switch field effect transistors (FETs) having a dynamic bias control circuit, according to aspects of the present disclosure. In this example, the switch stack 400 is coupled to an input RF voltage source ($V_{rf}$), an impedance ($Z_0$). A gate voltage source ($V_g$) is coupled to gate resistors ($R_g$) coupled to each gate of the switch FETs of the switch stack 400. In a shunt condition (when the switch is open), a switch FET gate of the switch stack 400 is negatively biased. The negative bias causes a hard turn-off condition for preventing an input radio frequency signal (e.g., the input power Pin) from traversing between a drain and a source of the switch FET. Although described with reference to a semiconductor on insulator (SOI) wafer, it should be recognized that the switch stack 400 is not limited to an SOI wafer and may be fabricated using a bulk semiconductor wafer.

Unfortunately, when the switch stack 400 is implemented using, for example, the switch FET 300 of FIG. 3A or the switch FET 350 of FIG. 3B, the switch stack 400 suffers from a higher real loss (represented by parameter Rp). As described, the net effect from parasitic losses to ground is represented by the real loss Rp. For example, the real loss Rp is calculated from measured antenna parameters (e.g., S-parameter Y(11)), in which the real loss Rp is equal to 1/real[Y(11)]. At low frequency, the real loss Rp is equal to the resistance value (Rb) of all the bias resistors (N) in parallel (e.g., Rg/N).

The switch FET 300 of FIG. 3A and the switch FET 350 of FIG. 3B have resistors at both the body region and the gate region. At low frequency, the real loss Rp for this configuration is equal to the resistance value Rb of all the bias resistors N and the resistance value Rb of the bias resistors in parallel (e.g., (Rg||Rb)/N), resulting in an increase of the real loss Rp. In practice, RF switches having a reduced real loss Rp are important for achieving antenna efficiency, for example, as shown in FIGS. 5-10B.

Figure 5:
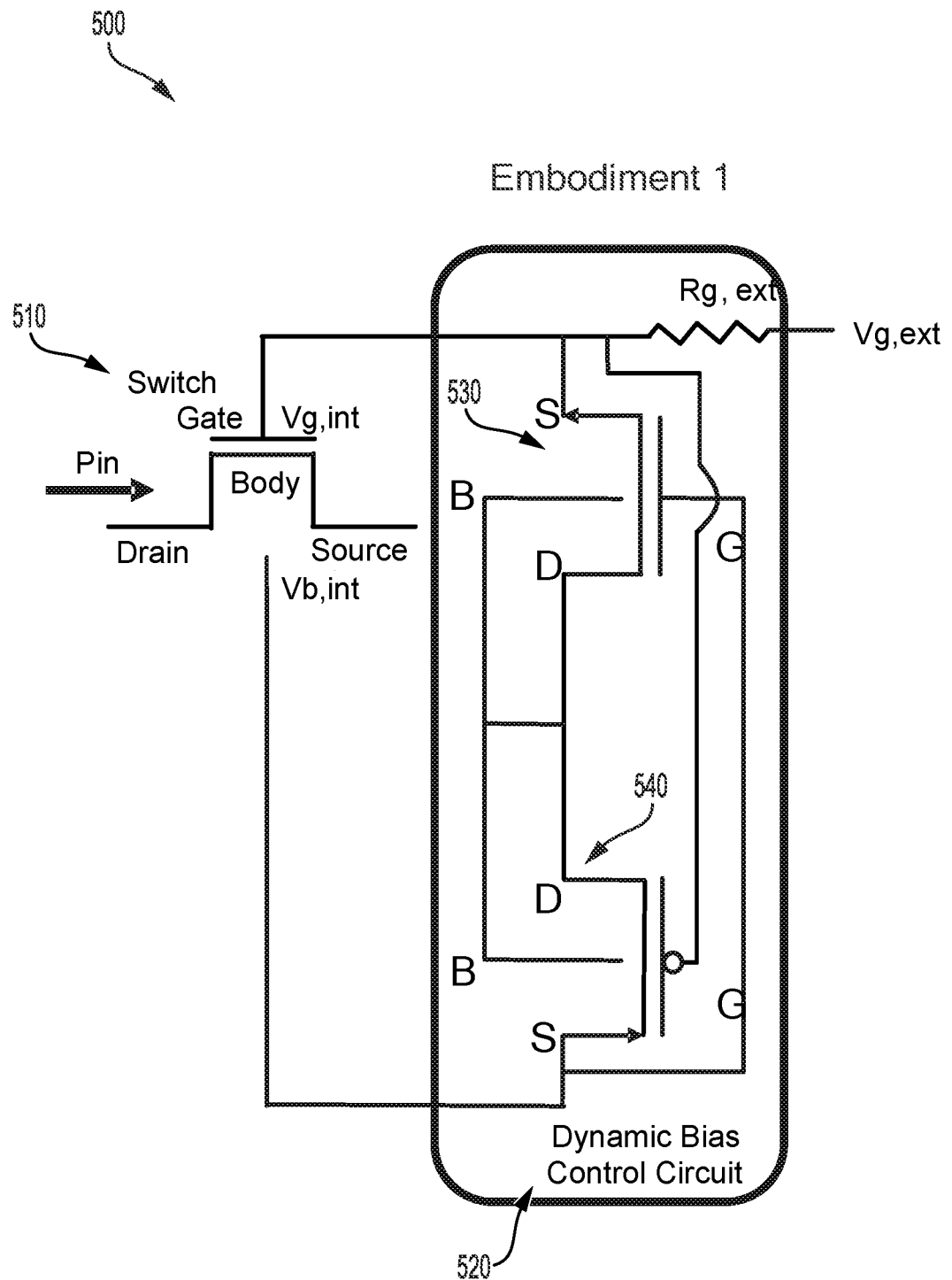
FIG. 5 is a schematic diagram illustrating a radio frequency (RF) integrated circuit (RFIC), including a switch field effect transistor (FET) and a dynamic bias control circuit for improving the performance of the switch FET, in accordance with aspects of the present disclosure.

FIG. 5 is a schematic diagram illustrating a radio frequency (RF) integrated circuit (RFIC) 500, including a switch field effect transistor (FET) 510 and a dynamic bias control circuit 520 for improving performance of the switch FET 510, in accordance with aspects of the present disclosure. In this configuration, the dynamic bias control circuit 520 is used for dynamic biasing of a body of the switch FET 510. In this example, the switch FET 510 includes an external gate resistor (Rg, ext) for supplying the switch FET 510 with a power supply, which may be electrically coupled to an external gate voltage (Vg, ext) node. The gate of the switch FET 510 is coupled to the gate resistor Rg, ext to provide an internal gate voltage (Vg, int).

In this configuration, the dynamic bias control circuit 520 is electrically coupled between the body and the gate of the switch FET 510. In this example, the dynamic bias control circuit 520 includes an N-channel metal oxide semiconductor (NMOS) transistor 530 and a P-channel metal oxide semiconductor (PMOS) transistor 540. In these aspects of the present disclosure, the NMOS transistor 530 includes an NMOS source terminal (S) coupled to the gate region of the switch FET 510, an NMOS drain terminal (D), an NMOS body terminal (B), and an NMOS gate terminal (G). In addition, the PMOS transistor 540 includes a PMOS source terminal (S) coupled to the body region of the switch FET 510, and a PMOS drain terminal (D) coupled to the NMOS drain terminal. The PMOS transistor 540 also includes a PMOS body terminal (B) coupled to the NMOS body terminal, and a PMOS gate terminal (G) coupled to the NMOS source terminal and the gate region of the switch FET 510.

In this configuration, the NMOS gate terminal is coupled to the PMOS source terminal and the body region of the switch FET 510. In addition, the NMOS drain terminal is coupled to the PMOS body terminal. As further illustrated in FIG. 5, the external gate resistor Rg, ext is coupled to the NMOS source terminal, the PMOS body terminal, and the gate region of the switch FET 510. In some aspects of the present disclosure, the dynamic bias control circuit 520 significantly improves an ON-state and an OFF-state performance of the switch FET 510, such as an on-resistance (Ron), a breakdown voltage (BVD), and the real loss Rp, which are important figures of merit (FOM). The dynamic bias control circuit 520 also significantly eliminates leakage problems that may be caused by de-biasing of the switch FET 510.

Figure 6:
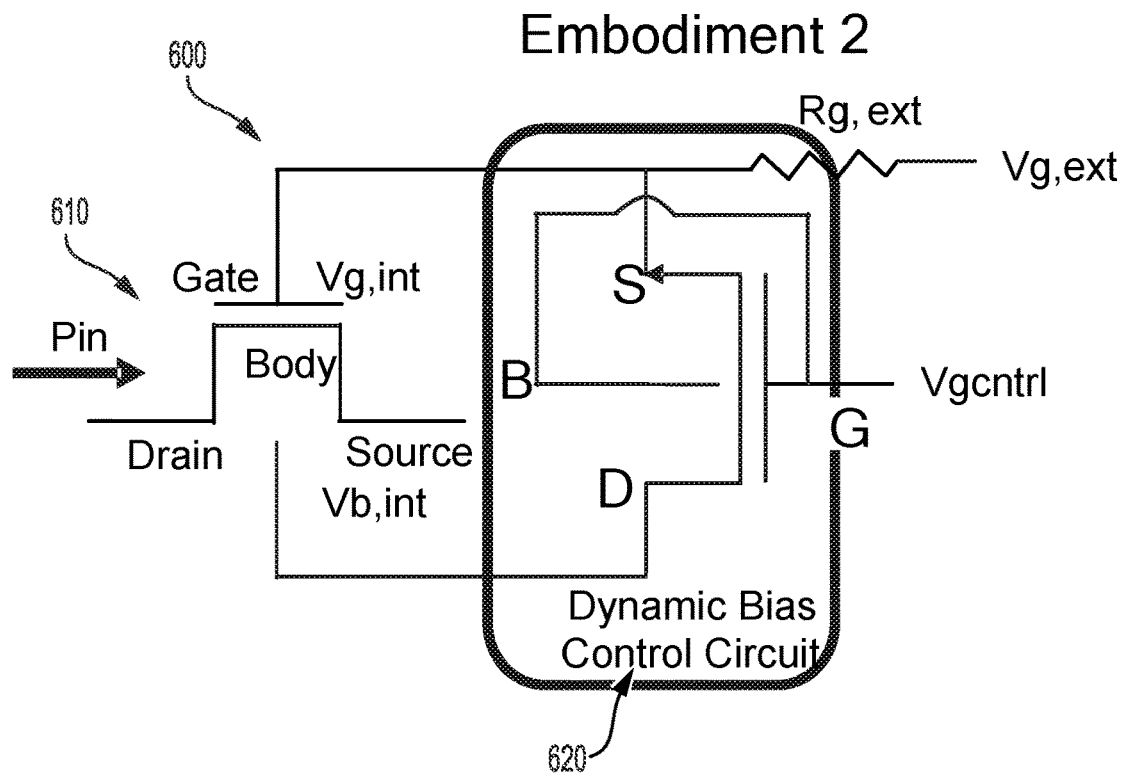
FIG. 6 is schematic diagrams illustrating a radio frequency (RF) integrated circuit (RFIC), including a switch field effect transistors (FET) and a dynamic bias control circuit for improving the performance of the switch FET, in accordance with aspects of the present disclosure.

FIG. 6 is a schematic diagrams illustrating a radio frequency (RF) integrated circuit (RFIC), including a switch FET 610 and a dynamic bias control circuit 620 for improving the performance of the switch FET 610, in accordance with aspects of the present disclosure. As shown in FIG. 6, an RFIC 600 including a dynamic bias control circuit 620 is implemented using a transistor for dynamically biasing the body of the switch FET 610 to improve the performance of the switch FET 610. In this example, the switch FET 610 also includes the external resistor Rg, ext (e.g., first gate resistor) for supplying the switch FET 610 with a power supply, which may be electrically coupled to the external gate voltage node Vg, ext.

As shown in FIG. 6, the dynamic bias control circuit 620 is electrically coupled between the body and the gate of the switch FET 610. In these examples, the dynamic bias control circuit 620 is implemented with an N-channel metal oxide semiconductor field effect transistor (MOSFET). In some aspects of the present disclosure, the N-channel MOSFET includes a MOSFET source terminal coupled to the gate region of the switch FET 610 and a MOSFET drain terminal coupled to a body region of the switch FET 610. In addition, the N-channel MOSFET includes a MOSFET body terminal electrically coupled to a MOSFET gate terminal.

Implementing the dynamic bias control circuit 620 with a dynamically controlled, N-channel MOSFET significantly improves the performance of the switch FET 610. In some aspects of the present disclosure, connecting the MOSFET gate terminal and the MOSFET body terminals of the N-channel MOSFET together and dynamically varying the gate potentials of the N-channel MOSFET and the switch FET 610 achieves improved body biasing of the switch FET 610. In operation, during an ON-state (e.g., switch gate voltage (Vgswitch)=positive control voltage) of the switch FET 610, biasing of the dynamic bias control circuit 620 (e.g., gate voltage control (Vgcntrl)=body voltage control (Vbcntrl)=0 V) is performed.

Biasing of the dynamic bias control circuit 620 results in an improved body voltage of the switch FET 610 (e.g., Vbswitch=100 millivolts (mV)). Beneficially, the improved body voltage of the switch FET 610 (e.g., Vbswitch=100 mV) exceeds the performance of a simple diode (approximately 0V), and also exceeds an independent body switch FET biasing configuration (e.g., Vbody=0). In an OFF-state of the switch FET 610 (e.g., Vgswitch=negative control voltage), biasing of the dynamic bias control circuit 620 (e.g., Vgcntrl=Vbcntrl=negative control voltage) is performed.

Biasing of the dynamic bias control circuit 620 results in an improved body voltage of the switch FET 610 (e.g., Vbswitch~negative control voltage). Beneficially, the improved body voltage of the switch FET 610 (e.g., Vbswitch~negative control voltage) exceeds the performance of a simple diode (e.g., Vbint~negative control voltage+Vdiode). While similar to the independent body switch FET biasing configuration (e.g., Vbody=negative control voltage), this configuration provides a significantly higher real loss Rp, which is similar to the diode connected body switch FET biasing configuration. In some aspects of the present disclosure, the dynamic bias control circuit 620 significantly improves an ON-state and an OFF-state performance of the switch FET 610, such as an on-resistance (Ron), a breakdown voltage (BVD), and the real loss Rp, which are important figures of merit. The dynamic bias control circuit 620 provides a substantial overall improvement (e.g., on the order of 15%-25%) in area reduction and/or performance improvement.

Figure 7:
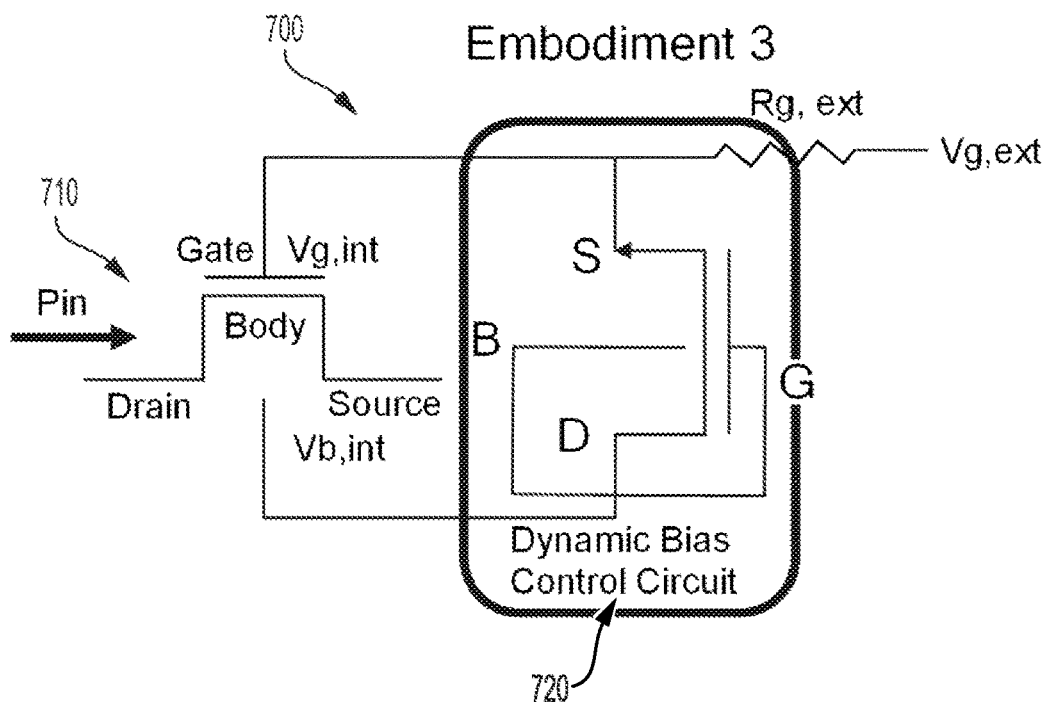
FIG. 7 is a schematic diagram illustrating a radio frequency (RF) integrated circuit (RFIC), including a switch field effect transistor (FET) and a dynamic bias control circuit for improving the performance of the switch FET, in accordance with aspects of the present disclosure.

FIG. 7 is a schematic diagram illustrating a radio frequency (RF) integrated circuit (RFIC) 700, including a switch FET 710 and a dynamic bias control circuit 720 for improving the performance of the switch FET 710, in accordance with aspects of the present disclosure. As shown in FIG. 7, the RFIC 700 includes the dynamic bias control circuit 720 also implemented using a transistor for dynamically biasing the body of the switch FET 710 to improve the performance of the switch FET 710. In this example, the switch FET 710 also includes the external resistor Rg, ext for supplying the switch FET 710 with a power supply, which may be electrically coupled to the external gate voltage node Vg, ext.

As shown in FIG. 7, the dynamic bias control circuit 720 is electrically coupled between the body and the gate of the switch FET 710. In this example, the dynamic bias control circuit 720 is implemented using a low threshold voltage (Vt) N-channel metal oxide semiconductor (NMOS) transistor. In some aspects of the present disclosure, the low Vt NMOS transistor includes an NMOS source terminal coupled to the gate region of the switch FET 710 and an NMOS drain terminal coupled to a body region of the switch FET 710. In addition, the low Vt NMOS transistor includes an NMOS body terminal electrically coupled to an NMOS gate terminal and the body region of the switch FET 710.

Implementing the dynamic bias control circuit 720 using a dynamically controlled, low Vt NMOS transistor significantly improves the performance of the switch FET 710. In some aspects of the present disclosure, connecting the NMOS gate terminal and the NMOS body terminals of the low Vt NMOS transistor to the body region of the switch FET 710 eliminates additional biasing specifications of the switch FET 710. For example, connecting the NMOS gate terminal and the NMOS body terminals of the low Vt NMOS transistor to the body region of the switch FET 710 eliminates an additional level shifter for the body control transistor of the RFIC 600 shown in FIG. 6.

In operation, during an ON-state (e.g., Vgswitch=positive control voltage) of the switch FET 710, an improved body voltage of the switch FET 710 (e.g., Vbswitch=260 mV) is achieved. Beneficially, the improved body voltage of the switch FET 710 (e.g., Vbswitch=200 mV) exceeds the performance of a simple diode (~7 mV), and also exceeds an independent body switch FET biasing configuration (e.g., Vbody=0). In an OFF-state of the switch FET 710 (e.g., Vgswitch=negative control voltage), biasing of the dynamic bias control circuit 720 (e.g., Vgcntrl=Vbcntrl=negative control voltage) is performed. Biasing of the dynamic bias control circuit 720 results in an improved body voltage of the switch FET 710 (e.g., Vbswitch negative control voltage).

Beneficially, the improved body voltage of the switch FET 710 (e.g., Vbswitch~negative control voltage) exceeds the performance of a single diode (e.g., Vbint~negative control voltage+Vdiode) configuration. While similar to the independent body switch FET biasing configuration (e.g., Vbody=~negative control voltage), this configuration provides a significantly higher real loss Rp, which is similar to the diode configurations shown in FIGS. 3A and 3B. In some aspects of the present disclosure, the dynamic bias control circuit 720 significantly improves an ON-state and an OFF-state performance of the switch FET 710, such as an on-resistance (Ron), a breakdown voltage (BVD), and the real loss Rp, which are important figures of merit.

Figure 8:
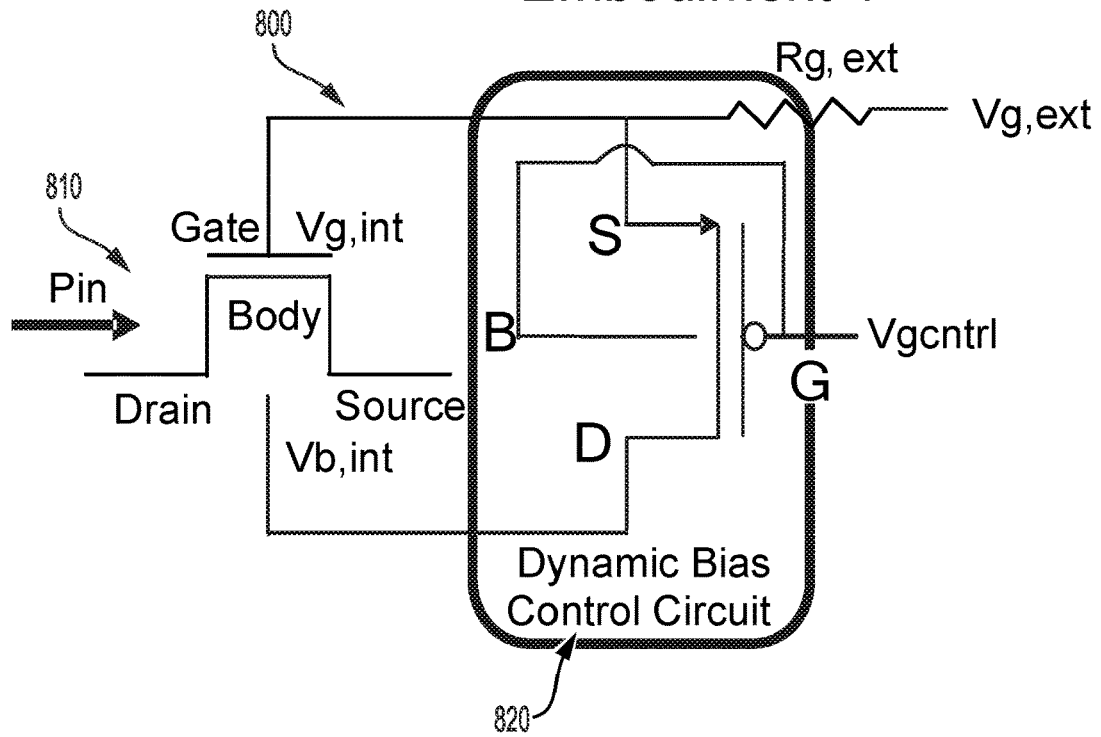
FIG. 8 is a schematic diagram illustrating a radio frequency (RF) integrated circuit (RFIC), including a switch field effect transistor (FET) and a dynamic bias control circuit for improving the performance of the switch FET, in accordance with aspects of the present disclosure.

FIG. 8 is a schematic diagram illustrating a radio frequency integrated circuits (RFIC), including a switch FET 810 and a dynamic bias control circuit 820 for improving the performance of the switch FET 810, in accordance with aspects of the present disclosure. As shown in FIG. 8, an RFIC 800 includes a dynamic bias control circuit 820 implemented using a transistor for dynamically biasing the body of the switch FET 810 to improve the performance of the switch FET 810. In this example, the switch FET 810 also includes the external resistor Rg, ext for supplying the switch FET 810 with a power supply, which may be electrically coupled to the external gate voltage node Vg, ext. In some aspects of the present disclosure, the dynamic bias control circuit 820 is implemented by replacing the N-channel metal oxide semiconductor field effect transistor (MOSFET) of FIG. 6 with a P-channel MOSFET in FIG. 8.

Figure 9:
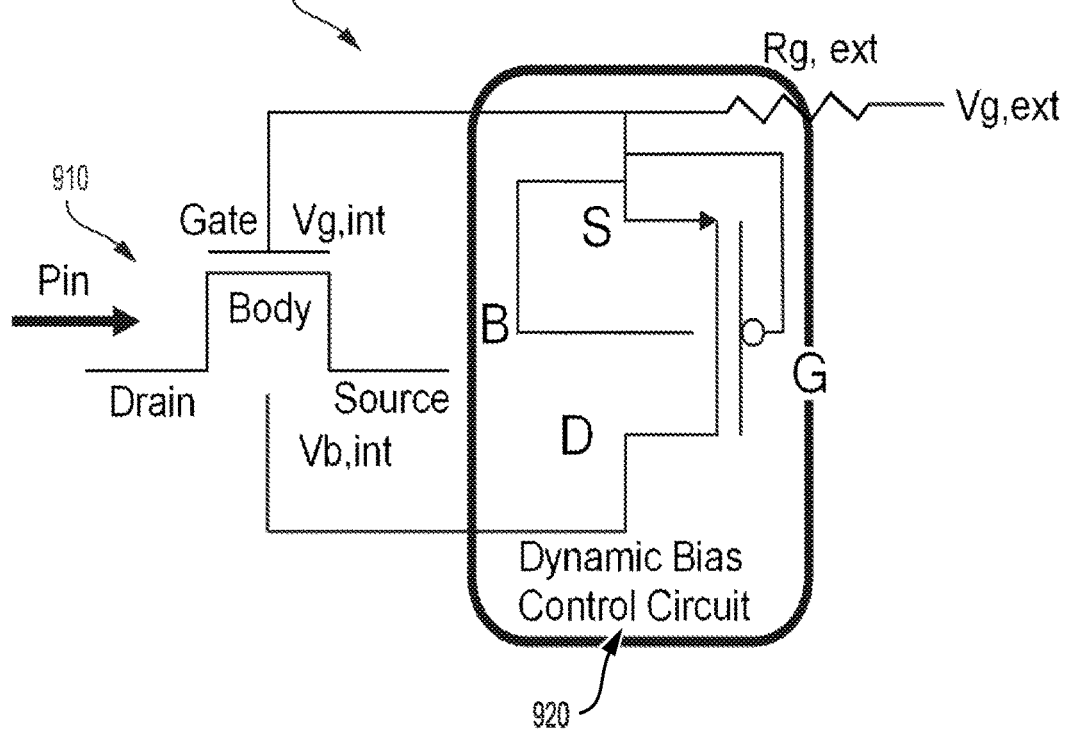
FIG. 9 is a schematic diagrams illustrating a radio frequency integrated circuits (RFIC), including a switch field effect transistors (FET) and a dynamic bias control circuit for improving the performance of the switch FET, in accordance with aspects of the present disclosure.

FIG. 9 is a schematic diagram illustrating a radio frequency (RF) integrated circuit (RFIC) 900, including a switch FET 910 and a dynamic bias control circuit 920 for improving the performance of the switch FET 810, in accordance with aspects of the present disclosure. As shown in FIG. 9, the RFIC 900 includes the dynamic bias control circuit 920 also implemented using a low threshold voltage (Vt) transistor for dynamically biasing the body of the switch FET 910 to improve the performance of the switch FET 910. In this example, the switch FET 910 also includes the external resistor Rg, ext for supplying the switch FET 910 with a power supply, which may be electrically coupled to the external gate voltage node Vg, ext. In some aspects of the present disclosure, the dynamic bias control circuit 920 is implemented by using a low voltage threshold (Vt) P-channel metal oxide semiconductor (PMOS) transistor. In this example, the low Vt PMOS transistor includes a PMOS source terminal coupled to the gate region of the switch FET 910 and a PMOS drain terminal coupled to a body region of the switch FET 910. In addition, the low Vt PMOS transistor includes a PMOS body terminal electrically coupled to a PMOS gate terminal, the PMOS source terminal, and the body region of the switch FET 910.

Figure 10A:
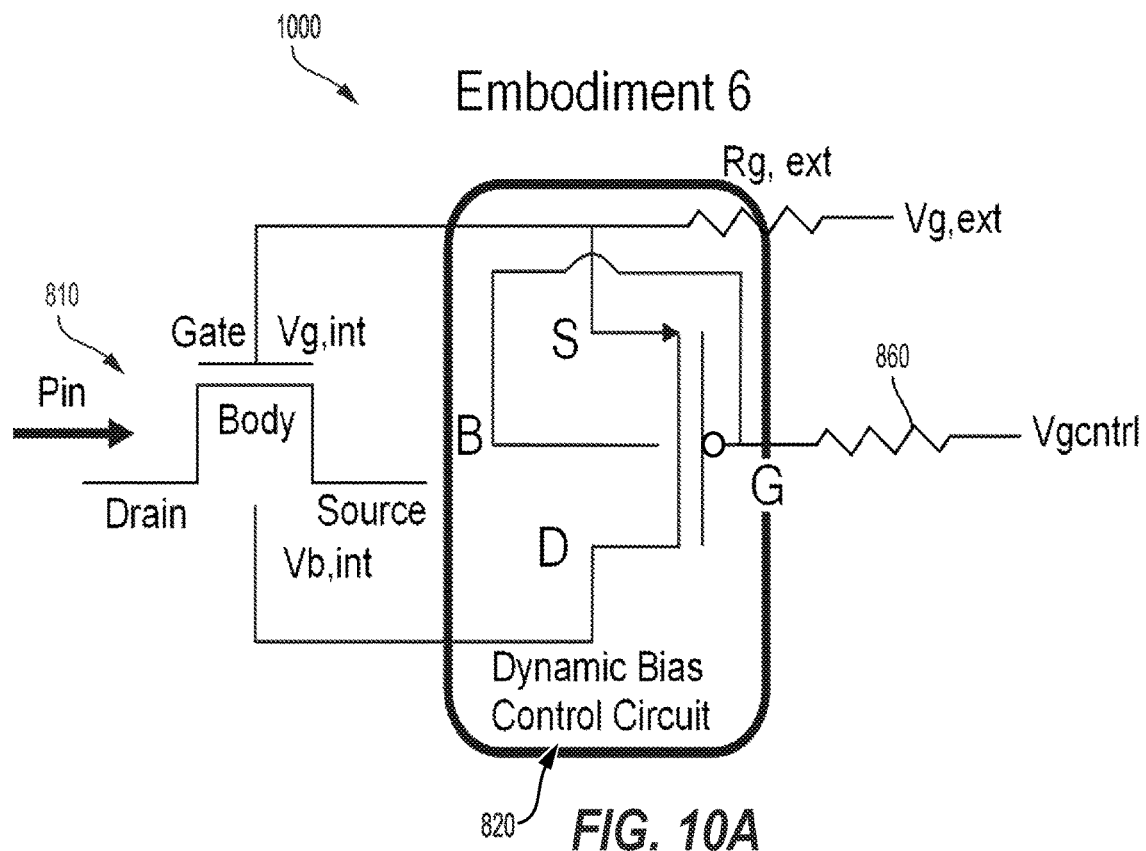
FIGS. 10A and 10B are schematic diagrams illustrating radio frequency (RF) integrated circuits (RFICs), including switch field effect transistors (FETs) and dynamic bias control circuits for improving the performance of the switch FETs, in accordance with aspects of the present disclosure.
Figure 10B:
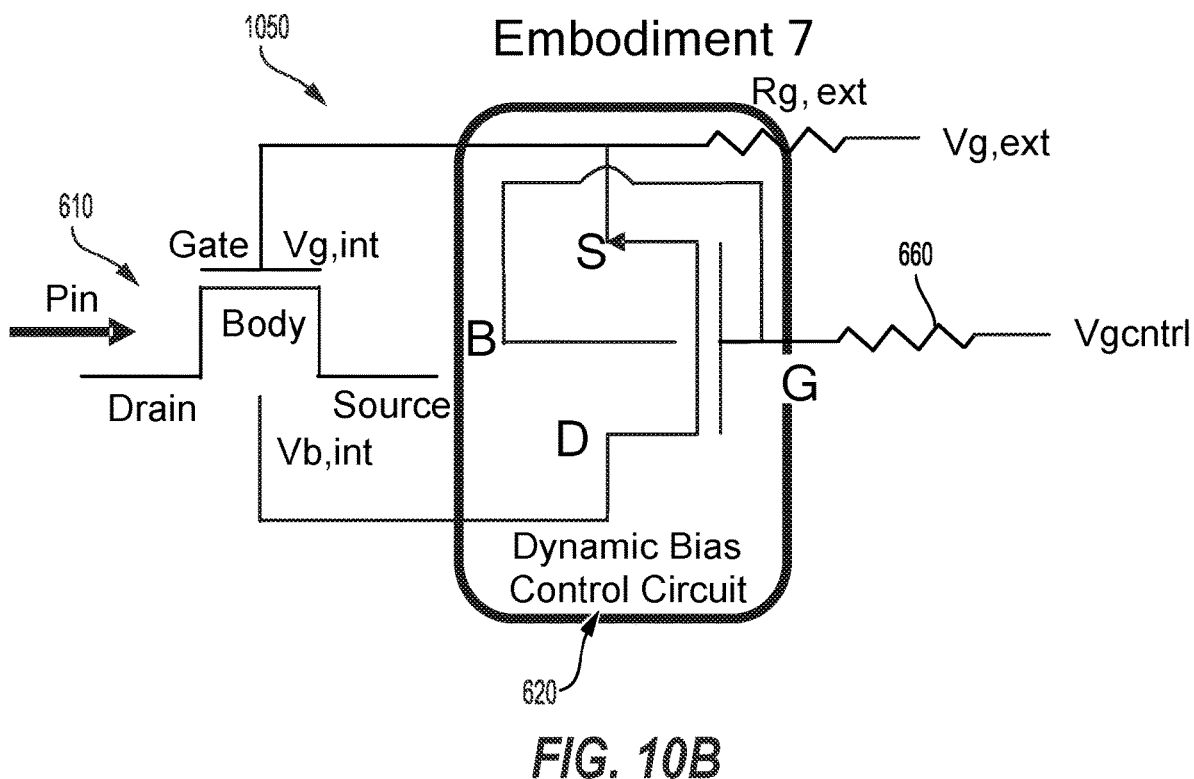

FIGS. 10A and 10B are schematic diagrams illustrating radio frequency (RF) integrated circuits (RFICs), including switch field effect transistors (FETs) and dynamic bias control circuits for improving the performance of the switch FETs, in accordance with aspects of the present disclosure. As shown in FIG. 10A, an RFIC 1000 includes the switch FET 810 and the dynamic bias control circuit 820 of FIG. 8, as well as a resistor 860 electrically coupled to the MOSFET gate terminal. As shown in FIG. 10B, an RFIC 1050 includes the switch FET 610 and the dynamic bias control circuit 620 of FIG. 6, and also a resistor 660 (e.g., second gate resistor) electrically coupled to the MOSFET gate terminal.

Referring again to FIG. 5, this configuration of the dynamic bias control circuit 520 as an NMOS/PMOS transistor combination control circuit eliminates challenges associated with a higher current in an ON-state associated with a conventional switch FET biasing configuration. In operation, during an ON-state of the switch FET 510, an internal body voltage (Vb, int) is approximately equal to 82 mV (e.g., Vb, int~82 mV) similar to a low threshold voltage gate biased control transistor, for example, as shown in FIGS. 6, 8, 10A, and 10B. The configuration of the dynamic bias control circuit 520 shown in FIG. 5 exceeds the performance of both diode connected and independent body switch FET biasing configurations. In operation, during an OFF-state, the internal body voltage (Vb, int) of the switch FET 510 equals approximately ~negative control voltage (e.g., Vbint~negative control voltage). This OFF-state operation is similar to the independent body switch FET biasing configuration, but with twice the real loss value (e.g., ~2×Rp) and exceeds the performance of a diode connected body switch FET biasing configuration (e.g., Vbint=~negative control voltage+Vdiode).

Various aspects of the present disclosure provide techniques for dynamic body biasing to improve the performance of a switch FET by using a dynamic bias control circuit, as shown in FIGS. 5-10B. Some aspects of the present disclosure provide an NMOS/PMOS transistor combination control circuit for performing dynamic body biasing of a switch FET, for example, as shown in FIG. 5. In other aspects of the present disclosure, the NMOS/PMOS transistor combination control circuit may be replaced with a dynamically controlled MOSFET (e.g., FIGS. 6, 8, 10A, and 10B), and a low threshold voltage transistor (e.g., FIGS. 7 and 9). A method of constructing an RFIC having a dynamic body bias control circuit, according to aspects of the present disclosure, is shown in FIG. 11.

Figure 11:
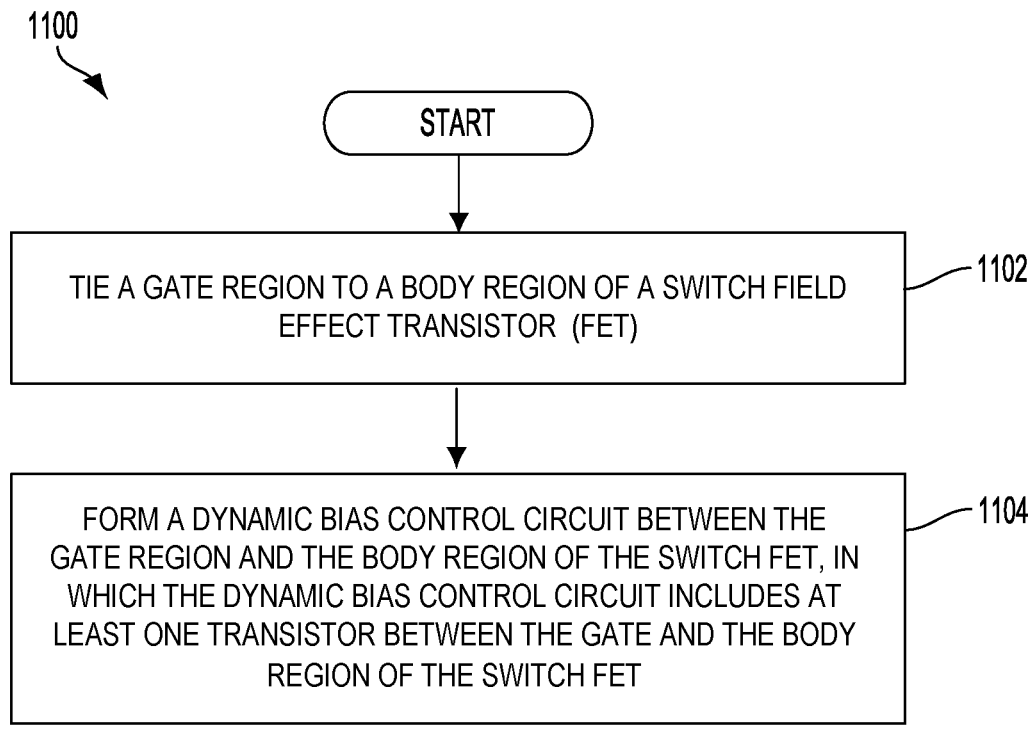
FIG. 11 is a process flow diagram illustrating a method for constructing a radio frequency (RF) integrated circuit (RFIC) having a dynamic bias control circuit, according to an aspect of the present disclosure.

FIG. 11 is a process flow diagram illustrating a method for constructing a radio frequency (RF) integrated circuit (RFIC) having a dynamic bias control circuit, according to an aspect of the present disclosure. A method 1100 begins in block 1102, in which a gate region is tied to a body region of a switch field effect transistor (FET). For example, as shown in FIGS. 5-10B, the gate region is tied to the body region of the switch FET 510/610/710/810/910. In block 1004, a dynamic bias control circuit is formed between the gate and the body region of the switch FET. For example, in FIGS. 5-1B, the dynamic bias control circuit 520/620/720/820/920 is formed between the gate and the body region of the switch FET 510/610/710/810/910.

As further shown in FIG. 11, in block 1104, the dynamic basis control circuit includes at least one transistor between the gate and the body region of the switch FET. For example, as shown in FIG. 5, the dynamic bias control circuit 520 includes an N-channel metal oxide semiconductor (NMOS) transistor 530 and a P-channel metal oxide semiconductor (PMOS) transistor 540. In this example, the NMOS source terminal is coupled to the gate region of the switch FET 510, and a PMOS drain terminal is coupled to the NMOS drain terminal. In addition, the PMOS source terminal is coupled to the body region of the switch FET 510 for performing dynamic body biasing of the switch FET 510. In other aspects of the present disclosure, the NMOS/PMOS transistor 530/540 combination control circuit of the dynamic bias control circuit 520 may be replaced with a dynamically controlled metal oxide semiconductor field effect transistor (MOSFET) (e.g., FIGS. 6, 8, 10A, and 10B), or a low threshold voltage transistor (e.g., FIGS. 7 and 9).

Aspects of the present disclosure relate to a dynamic bias control circuit for improving the performance of an RF switch device. That is, aspects of the present disclosure employ dynamic control of at least one transistor of the dynamic bias control circuit to dynamically bias a body bias of the RF switch device. According to these aspects of the present disclosure, an RFIC includes a switch FET having a source region, a drain region, a body region, and a gate region. The RFIC also includes a dynamic bias control circuit including at least one transistor coupled between the body region and the gate region of the switch FET.

According to a further aspect of the present disclosure, an RF integrated circuit, including a switch FET, is described. The switch FET includes means for dynamically biasing a body region of the switch FET. The dynamic biasing means may be the dynamic body bias control circuit, shown in FIGS. 5-10B. In another aspect, the aforementioned means may be any module or any apparatus configured to perform the functions recited by the aforementioned means.

Figure 12:
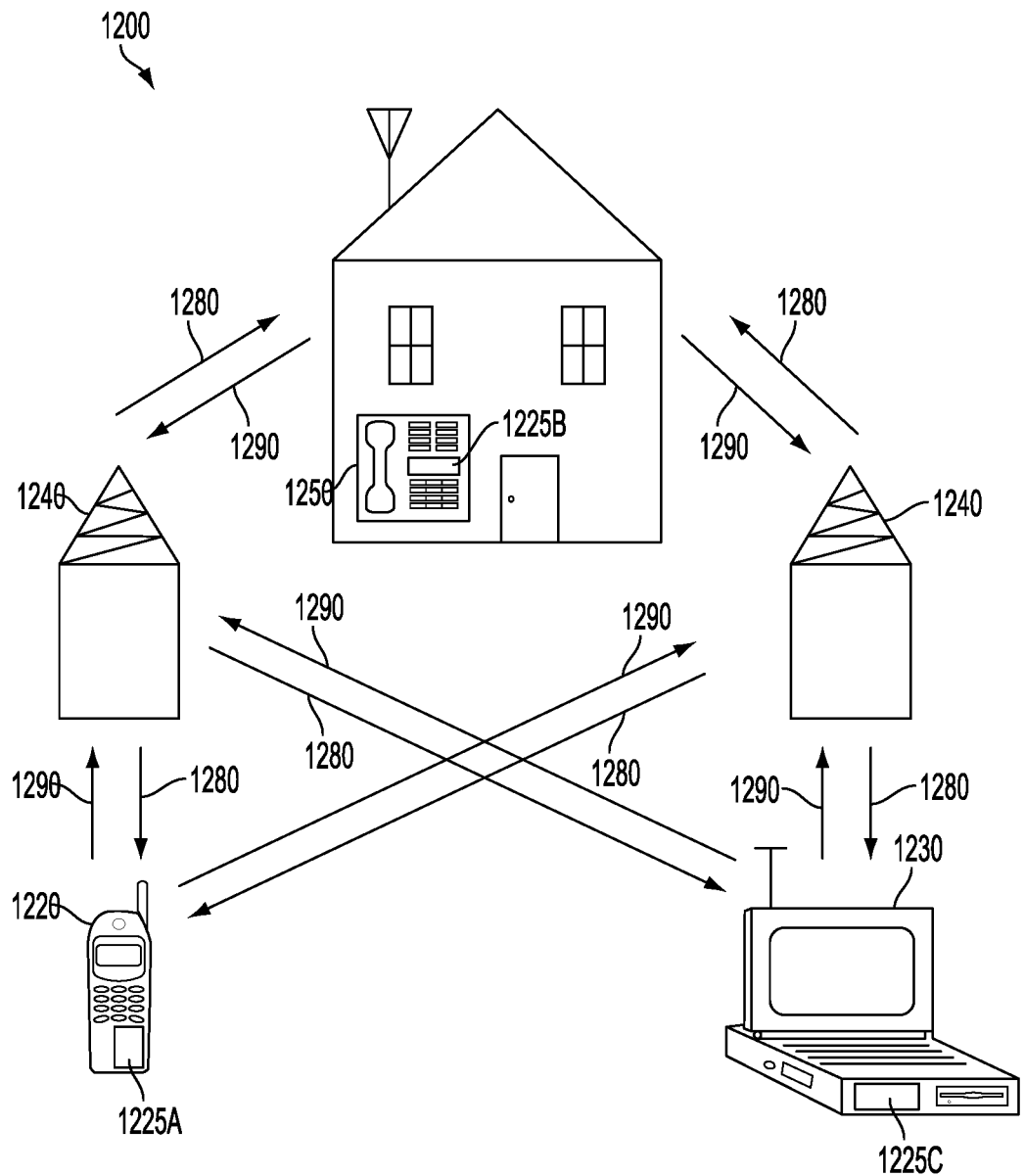
FIG. 12 is a block diagram showing an exemplary wireless communications system in which a configuration of the present disclosure may be advantageously employed.

FIG. 12 is a block diagram showing an exemplary wireless communications system 1200 in which an aspect of the present disclosure may be advantageously employed. For purposes of illustration, FIG. 12 shows three remote units 1220, 1230, and 1250 and two base stations 1240. It will be recognized that wireless communications systems may have many more remote units and base stations. Remote units 1220, 1230, and 1250 include IC devices 1225A, 1225C, and 1225B that include the disclosed switch field effect transistors (FETs) and dynamic bias control circuits. It will be recognized that other devices may also include the disclosed switch field effect transistors (FETs) and dynamic bias control circuits, such as the base stations, switching devices, and network equipment. FIG. 12 shows forward link signals 1280 from the base station 1240 to the remote units 1220, 1230, and 1250 and reverse link signals 1290 from the remote units 1220, 1230, and 1250 to base stations 1240.

In FIG. 12, remote unit 1220 is shown as a mobile telephone, remote unit 1230 is shown as a portable computer, and remote unit 1250 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 12 illustrates remote units, according to the aspects of the present disclosure, the present disclosure is not limited to these exemplary illustrated units. Aspects of the present disclosure may be suitably employed in many devices, which include the disclosed switch field effect transistors (FETs) and dynamic bias control circuits.

Figure 13:
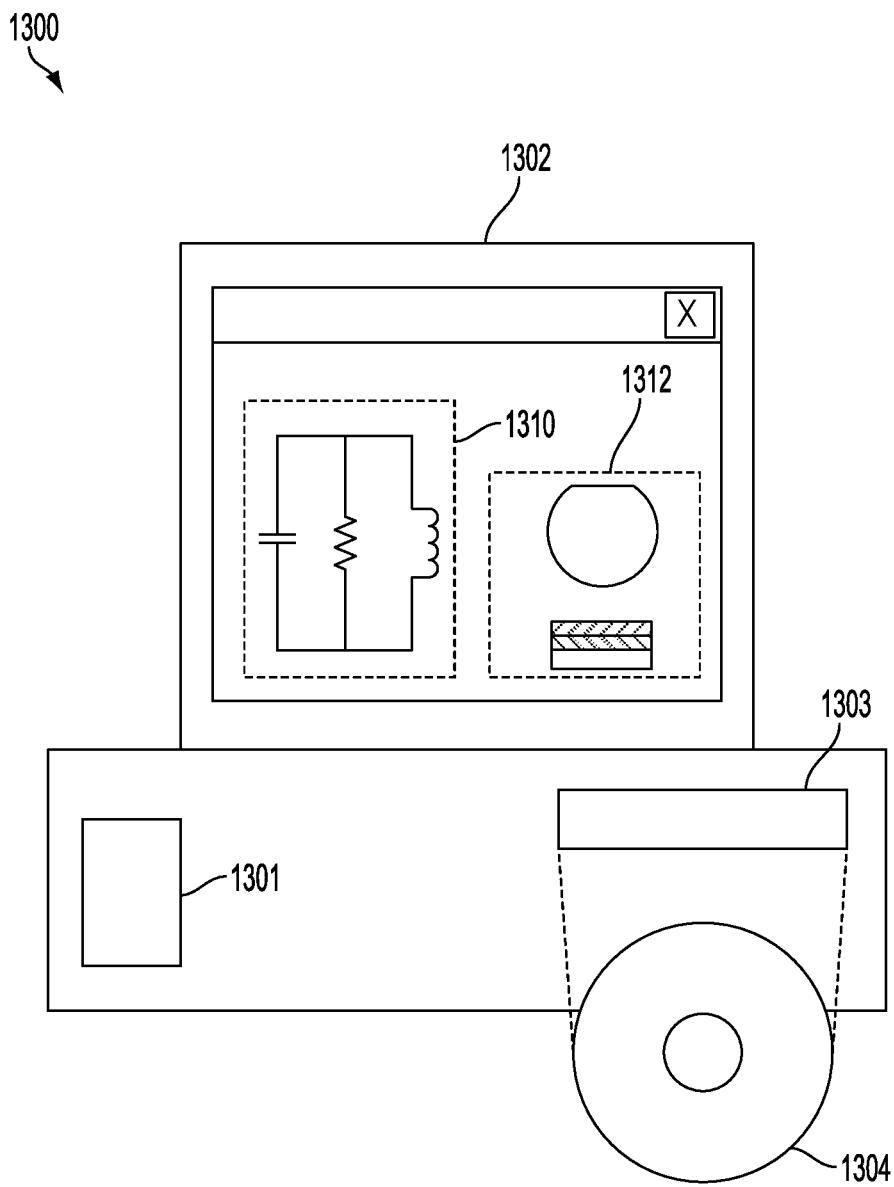
FIG. 13 is a block diagram illustrating a design workstation used for circuit, layout, and logic design of a semiconductor component, according to one configuration.

FIG. 13 is a block diagram illustrating a design workstation used for circuit, layout, and logic design of a semiconductor component, such as the switch field effect transistors (FETs) and dynamic bias control circuits disclosed above. A design workstation 1300 includes a hard disk 1301 containing operating system software, support files, and design software such as Cadence or OrCAD. The design workstation 1300 also includes a display 1302 to facilitate a circuit design 1310 or an RFIC 1312. A storage medium 1304 is provided for tangibly storing the circuit design 1310 or the RFIC 1312. The circuit design 1310 or the RFIC 1312 may be stored on the storage medium 1304 in a file format such as GDSII or GERBER. The storage medium 1304 may be a CD-ROM, DVD, hard disk, flash memory, or other appropriate device. Furthermore, the design workstation 1300 includes a drive apparatus 1303 for accepting input from or writing output to the storage medium 1304.

Data recorded on the storage medium 1304 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1304 facilitates the design of the circuit design 1310 or the RFIC 1312 by decreasing the number of processes for designing semiconductor wafers.

Implementation examples are described in the following numbered clauses:

1. A radio frequency integrated circuit (RFIC), comprising:
   a switch field effect transistor (FET) including a source region, a drain region, a body region, and a gate region; and
   a dynamic bias control circuit comprising at least one transistor coupled between the body region and the gate region of the switch FET.

2. The RFIC of clause 1, in which the dynamic bias control circuit comprises:
   an N-channel metal oxide semiconductor (NMOS) transistor, including an NMOS source terminal coupled to the gate region of the switch FET, an NMOS drain terminal, an NMOS body terminal, and an NMOS gate terminal; and
   a P-channel metal oxide semiconductor (PMOS) transistor, including a PMOS source terminal coupled to the body region of the switch FET, a PMOS drain terminal coupled to the NMOS drain terminal, a PMOS body terminal coupled to the NMOS body terminal, and a PMOS gate terminal coupled to the NMOS source terminal and the gate region of the switch FET.

3. The RFIC of clause 2, in which the NMOS gate terminal is coupled to the PMOS source terminal and the body region of the switch FET.

4. The RFIC of any of clauses 2 or 3, in which the NMOS drain terminal is coupled to the PMOS body terminal.

5. The RFIC of any of clauses 2-4, further comprising a gate resistor coupled to the NMOS source terminal, the PMOS gate terminal, and the gate region of the switch FET.

6. The RFIC of clause 1, in which the at least one transistor comprises an N-channel metal oxide semiconductor (NMOS) transistor, including an NMOS source terminal coupled to the gate region of the switch FET, an NMOS drain terminal coupled to the body region of the switch FET, an NMOS body terminal, and an NMOS gate terminal coupled to the NMOS body terminal.

7. The RFIC of clause 6, further comprising a first gate resistor coupled to the NMOS source terminal and the gate region of the switch FET.

8. The RFIC of any of clauses 6 or 7, further comprising a second gate resistor coupled to the NMOS gate terminal and the NMOS body terminal.

9. The RFIC of clause 1, in which the at least one transistor comprises an N-channel metal oxide semiconductor (NMOS)transistor, including an NMOS source terminal coupled to the gate region of the switch FET, an NMOS drain terminal coupled to the body region of the switch FET, an NMOS body terminal coupled to the NMOS drain terminal, and an NMOS gate terminal coupled to the NMOS drain terminal.

10. The RFIC of clause 9, further comprising a gate resistor coupled to the NMOS source terminal and the gate region of the switch FET.

11. The RFIC of clause 1, in which the at least one transistor comprises a P-channel metal oxide semiconductor (PMOS) transistor, including a PMOS source terminal coupled to the gate region of the switch FET, a PMOS drain terminal coupled to the body region of the switch FET, a PMOS body terminal, and a PMOS gate terminal coupled to the PMOS body terminal.

12. The RFIC of clause 11, further comprising a first gate resistor coupled to the PMOS source terminal and the gate region of the switch FET.

13. The RFIC of any of clauses 11 or 12, further comprising a second gate resistor coupled to the PMOS gate terminal and the PMOS body terminal.

14. The RFIC of clause 1, in which the at least one transistor comprises a P-channel metal oxide semiconductor (PMOS) transistor, including a PMOS source terminal coupled to the gate region of the switch FET, a PMOS drain terminal coupled to the body region of the switch FET, a PMOS body terminal coupled to the PMOS source terminal, and a PMOS gate terminal coupled to the PMOS source terminal.

15. The RFIC of clause 14, further comprising a gate resistor coupled to the PMOS source terminal and the gate region of the switch FET.

16. The RFIC of any of clauses 1-15, integrated into an RF front end module, the RF front end module incorporated into at least one of a music player, a video player, an entertainment unit, a navigation device, a communications device, a personal digital assistant (PDA), a fixed location data unit, a mobile phone, and a portable computer.

17. A method of constructing a radio frequency integrated circuit (RFIC) having a switch field effect transistor (FET), comprising:

tying a gate region to a body region of the switch FET; and forming a dynamic bias control circuit between the gate region and the body region of the switch FET, in which the dynamic bias control circuit comprises at least one transistor between the gate region and the body region of the switch FET.

18. The method of clause 17, in which the dynamic bias control circuit comprises:

an N-channel metal oxide semiconductor (NMOS) transistor, including an NMOS source terminal coupled to the gate region of the switch FET, an NMOS drain terminal, an NMOS body terminal, and an NMOS gate terminal; and a P-channel metal oxide semiconductor (PMOS) transistor, including a PMOS source terminal coupled to the body region of the switch FET, a PMOS drain terminal coupled to the NMOS drain terminal, a PMOS body terminal coupled to the NMOS body terminal, and a PMOS gate terminal coupled to the NMOS source terminal and the gate region of the switch FET.

19. The method of clause 18, in which the dynamic bias control circuit further comprises a gate resistor coupled to the NMOS source terminal, the PMOS gate terminal, and the gate region of the switch FET.

20. The method of any of clauses 17-19, further comprising integrating the RFIC into an RF front end module, the RF front end module incorporated into at least one of a music player, a video player, an entertainment unit, a navigation device, a communications device, a personal digital assistant (PDA), a fixed location data unit, a mobile phone, and a portable computer.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus.

For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the present disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding configurations described herein may be utilized, according to the present disclosure. Accordingly, the appended claims are intended to include within their scope such processes, machines, manufacture, compositions of matter, means, methods, or steps.

What is claimed is:

1. A radio frequency (RF) integrated circuit (RFIC), comprising:
   a switch field effect transistor (FET) including a source region, a drain region, a body region, and a gate region; and
   a dynamic bias control circuit comprising:
   an N-channel metal oxide semiconductor (NMOS) transistor, including an NMOS source terminal coupled to the gate region of the switch FET, an NMOS drain terminal, an NMOS body terminal, and an NMOS gate terminal; and
   a P-channel metal oxide semiconductor (PMOS) transistor, including a PMOS source terminal coupled to the body region of the switch FET, a PMOS drain terminal coupled to the NMOS drain terminal, a PMOS body terminal coupled to the NMOS body terminal, and a PMOS gate terminal coupled to the NMOS source terminal and the gate region of the switch FET, in which the NMOS drain terminal is coupled to the PMOS body terminal and the PMOS drain terminal is coupled to the NMOS body terminal, in which the switch FET, the NMOS transistor and the PMOS transistor comprise RF silicon on insulator (SOI) devices.

2. The RFIC of claim 1, in which the NMOS gate terminal is coupled to the PMOS source terminal and the body region of the switch FET.

3. The RFIC of claim 1, further comprising a gate resistor coupled to the NMOS source terminal, the PMOS gate terminal, and the gate region of the switch FET.

4. The RFIC of claim 1, integrated into an RF front end module, the RF front end module incorporated into at least one of a music player, a video player, an entertainment unit, a navigation device, a communications device, a personal digital assistant (PDA), a fixed location data unit, a mobile phone, and a portable computer.

5. A method of constructing a radio frequency (RF) integrated circuit (RFIC) having a switch field effect transistor (FET), comprising:
   tying a gate region to a body region of the switch FET; and
   forming a dynamic bias control circuit between the gate region and the body region of the switch FET, in which the dynamic bias control circuit comprises at least one transistor between the gate region and the body region of the switch FET, wherein the dynamic bias control circuit comprises:
   an N-channel metal oxide semiconductor (NMOS) transistor, including an NMOS source terminal coupled to the gate region of the switch FET, an NMOS drain terminal, an NMOS body terminal, and an NMOS gate terminal; and
   a P-channel metal oxide semiconductor (PMOS) transistor, including a PMOS source terminal coupled to the body region of the switch FET, a PMOS drain terminal coupled to the NMOS drain terminal, a PMOS body terminal coupled to the NMOS body terminal, and a PMOS gate terminal coupled to the NMOS source terminal and the gate region of the switch FET, in which the NMOS drain terminal is coupled to the PMOS body terminal and the PMOS drain terminal is coupled to the NMOS body terminal, in which the switch FET, the NMOS transistor and the PMOS transistor comprise RF silicon on insulator (SOI) devices.

6. The method of claim 5, in which the dynamic bias control circuit further comprises a gate resistor coupled to the NMOS source terminal, the PMOS gate terminal, and the gate region of the switch FET.

7. The method of claim 5, further comprising integrating the RFIC into an RF front end module, the RF front end module incorporated into at least one of a music player, a video player, an entertainment unit, a navigation device, a communications device, a personal digital assistant (PDA), a fixed location data unit, a mobile phone, and a portable computer.

* * * * *